(12) United States Patent
Weinmann et al.

(10) Patent No.: US 8,662,155 B2
(45) Date of Patent: Mar. 4, 2014

(54) CHIP COOLING DEVICE HAVING WEDGE ELEMENT

(75) Inventors: Klaus Weinmann, Gersthofen (DE); Philipp Hortmann, Augsburg (DE)

(73) Assignee: GE Intelligent Platforms Embedded Systems, Inc., Charlottesville, VA (US)

( * ) Notice: Subject to any disclaimer, the term of this patent is extended or adjusted under 35 U.S.C. 154(b) by 283 days.

(21) Appl. No.: 12/682,302

(22) PCT Filed: Oct. 10, 2008

(86) PCT No.: PCT/EP2008/063683
§ 371 (c)(1),
(2), (4) Date: Jun. 21, 2010

(87) PCT Pub. No.: WO2009/050130
PCT Pub. Date: Apr. 23, 2009

(65) Prior Publication Data
US 2012/0000636 A1    Jan. 5, 2012

(30) Foreign Application Priority Data
Oct. 11, 2007 (DE) .......................... 10 2007 049 035

(51) Int. Cl.
*F28F 7/00* (2006.01)

(52) U.S. Cl.
USPC ........................................ 165/185; 165/80.3

(58) Field of Classification Search
USPC ............... 165/80.3, 185, 80.4, 146, 80.2, 79; 361/697, 702, 704, 707; 257/718, 719, 257/720; 174/16.3
See application file for complete search history.

(56) References Cited

U.S. PATENT DOCUMENTS 4,462,462 A * 7/1984 Meagher et al. ............. 165/80.1
4,563,725 A * 1/1986 Kirby ............................ 361/708
(Continued)

FOREIGN PATENT DOCUMENTS

DE    60209423 T2    8/2006
EP    0288183 A    10/1988
(Continued)

OTHER PUBLICATIONS

"Spherical Cooling Device", IBM Tech-nical Disclosure Bulletin, IBM Corp., New York, US, vol. 34, No. 2, Jul. 1, 1991, pp. 1-03, XP000210548ISSN: 0018-8689.
International Search Report for DE Patent Application No. 102007049035.8 filed on Oct. 11, 2007.

*Primary Examiner* — Tho V Duong
(74) *Attorney, Agent, or Firm* — Mark A. Conklin

(57) ABSTRACT

The present invention relates to a cooling device improving the heat transfer between a chip (2) having a semiconducting substrate (3) and a heat sink (7). The gap between a surface (11) of the chip (2) to be cooled and a surface (12) of the heat sink (7), the width of which depends on production tolerances of the elements and soldered connections, is formed as a wedge shape by an angled lower surface (12) of the heat sink, in order to create a wedge-shaped gap. A wedge element (17) having the same wedge angle as the wedge-shaped gap is inserted into said gap exactly far enough that it makes flat contact with both the chip surface (11) to be cooled and the heat sink surface (12). Dimensional deviations are thus compensated for, the use of gap fillers is avoided, and the heat transfer from the heat source to the heat sink is improved.

13 Claims, 1 Drawing Sheet

(56) References Cited

U.S. PATENT DOCUMENTS

| | | | |
|---|---|---|---|
| 4,764,845 A * | 8/1988 | Artus | 361/705 |
| 5,028,969 A | 7/1991 | Kasahara et al. | |
| 5,184,281 A * | 2/1993 | Samarov et al. | 361/704 |
| 6,304,449 B1 * | 10/2001 | Zhang | 361/704 |
| 7,009,284 B2 * | 3/2006 | Nakase et al. | 257/675 |
| 2005/0047092 A1 * | 3/2005 | Whit et al. | 361/704 |

FOREIGN PATENT DOCUMENTS

| | | |
|---|---|---|
| EP | 0354722 A | 2/1990 |
| JP | 10107189 A * | 4/1998 |
| WO | 9916128 A | 4/1999 |

\* cited by examiner

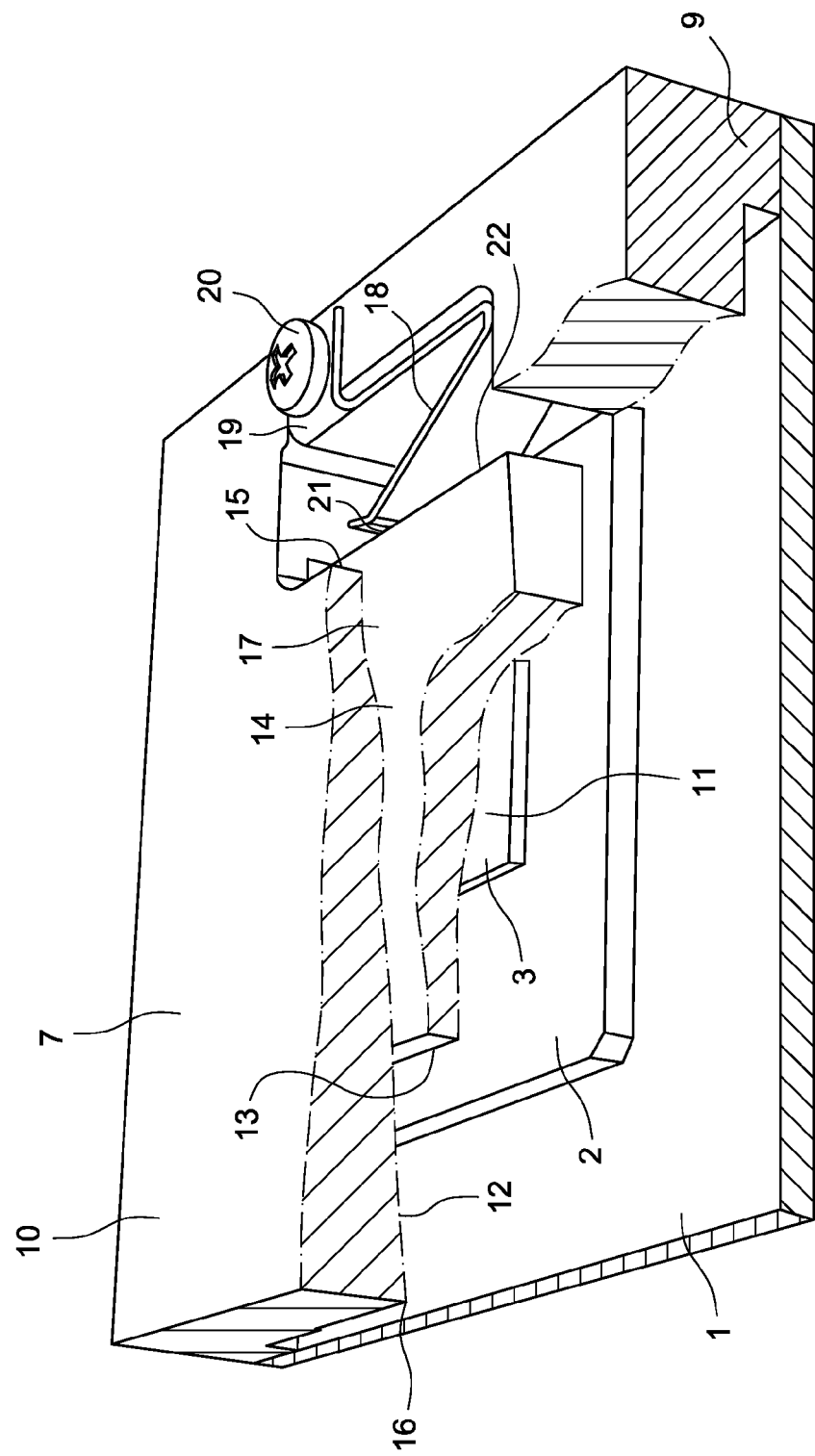

CHIP COOLING DEVICE HAVING WEDGE ELEMENT

BACKGROUND OF THE INVENTION

The present invention relates, in general, to cooling devices and, in particular, to devices for cooling integrated semiconductor components such as, for example, processors, on printed circuits. With the aid of a wedge element, the present invention provides effective thermal coupling between a heat source and a heat sink.

DESCRIPTION OF PRIOR ART

The increased capacity of processors and other integrated circuits has also resulted in an increased generation of waste heat due to these components and thus in increased demands on cooling them. The heat development reaches power densities on the order of 100 W/cm$^2$ and thus exceeds, e.g., common stove tops by a multiple. At the same time, permissible maximum temperatures of integrated circuits are typically in a range of approximately 60° C. to 90° C., whereby, if these temperatures are exceeded, technical failure or permanent destruction must be taken into account. The temperature difference available with respect to room temperature is not enough, by far, to passively dissipate heat generated by natural radiation and convection, e.g., in the case of processors of PCs.

Heat sinks are used for heat dissipation, said heat sinks consisting, in most cases, of aluminum or copper and having cooling ribs for surface enlargement. Thermal energy is removed by forced convection with a blower. Other solutions such as, e.g., fluid-cooled systems, have been found to be expensive. Although the known cooling systems, achieve their objectives, e.g., in commercially available PCs, they do have various disadvantages. A further increase of computing power also increases the costs and the energy consumption of the cooling system. In addition, the ventilators that are used make considerable noise, to which people working on a computer are continually exposed. Therefore, various measures have been taken in order to increase the efficiency of cooling devices.

Inasmuch as heat is generated on a very small surface, good heat transfer to the heat sink that, as a rule, is substantially larger is of decisive importance. However, in many cases, a direct attachment of the heat sink to a chip housing is undesirable because, as a result to his, the risk of damaging the sensitive chip exists during assembly and later operation. Therefore, robust embodiments of cooling devices frequently require that the heat sink be directly connected to the circuit board of a printed circuit.

DE 602 09 423 T2 discloses a cooling device for microchips that are mounted on a circuit board. A heat sink is connected to the circuit board in such a manner that said heat sink is in planar abutment with the circuit board. For the accommodation of each chip, a recess is provided in the heat sink. A gap remains between the circuit board and the heat sink, said gap compensating for manufacturing tolerances of the elements, so that the chip cannot be clamped directly between the circuit board and the heat sink. The gap contains a kneadable, heat-conducting material that is plastically compressed to the respective gap width during assembly and establishes a thermal connection between the chip and the heat sink.

The dimensional tolerances may typically add on the order of approximately 1 mm. Inasmuch as the thermal conductivity of such thermally conductive materials, however, as a rule, accounts for only a fraction of the thermal conductivity of the heat sink—that, in most cases, consists of metal—already a relatively narrow gap represents a considerable thermal resistance. A temperature gradient occurring in the intermediate space between the chip and the heat sink is no longer available for the release of heat to the air and can have the result that the cooler cannot be used for chips with high power loss and/or with high ambient temperatures. Alternatively, other measures such as a larger heat sink or a more powerful blower must be used to remedy this. Therefore, there has been the objective of improving the heat transfer between the chip and the heat sink.

It is the object of the present invention to provide a robust cooling device exhibiting improved heat transfer between the heat source and the heat sink. This object is achieved with a cooling device displaying the features of patent claim 1.

SUMMARY OF THE INVENTION

The present invention provides a cooling device comprising a carrier element, a heat source connected to the carrier element, said heat source having a first surface and a heat sink connected with the carrier element and having a second surface. The first and the second surfaces are located opposite each other and form a wedge-shaped intermediate space that is disposed to accommodate a wedge element. The wedge element has a third and a fourth surface, said surfaces being disposed to abut against the first surface of the heat source or the second surface of the heat sink and to establish a connection displaying high thermal conductivity between them.

The present invention makes it possible to intimately connect the heat source, as well as the heat sink, with the carrier element and still establish an essentially interruption-free connection between the heat source and the heat sink. This is made possible by the inventive wedge element that is inserted in the wedge-shaped intermediate space between the heat source and the heat sink. Manufacturing tolerances leading to height differences of the first and the second surfaces of the heat source or the heat sink, said surfaces delimiting the wedge-shaped intermediate space, can have the effect that the width of the intermediate space deviates clearly from the desired value. Whereas prior art provides a sufficiently thick layer of a plastically deformable thermally conductive material for compensation between the semiconducting element and the heat sink, the wedge element in accordance with the invention achieves an adaptation to the actual width of the intermediate space by a lateral shift alone. Depending on width, said wedge element is inserted differently wide into the wedge-shaped intermediate space until said wedge element's third and fourth surfaces come into preferably planar abutment on the first surface of the heat source or on the second surface of the heat sink, preferably being biased.

The first surface of the heat source and the second surface of the heat sink may each have a flat region, these regions being located opposite each other and inclined toward each other at an acute angle. Each of the third and the fourth surfaces of the wedge element preferably has a flat region, whereby the flat regions of the third and fourth surfaces of the wedge element are inclined toward each other at an angle that is equal to the angle between the flat regions of the first surface of the heat source and the second surface of the heat sink. Preferably, the wedge element is configured in such a manner that it can be inserted in the wedge-shaped intermediate space between the heat source and the heat sink, whereby the first region of the first surface of the heat source abuts in a planar manner against the flat region of the third surface of the wedge element, and the flat region of the second surface of the heat sink abuts in a planar manner against the flat region of the fourth surface of the wedge element. Preferably, the wedge element has a plate-like shape, whereby, due to the inclination of the lower and upper sides or the third and fourth surfaces relative to each other, said wedge element has a wide and a narrow end.

Apart from the flat regions, the heat source, the heat sink and the wedge element may have other surface regions that are, however, configured in such a manner that they do not impair the insertion of the wedge element in the wedge-shaped intermediate space and do not impair the planar abutment of the flat regions. The angle between the flat regions is preferable within a range of approximately 5° to 10°. Such an acute angle makes it possible for the wedge-shaped intermediate space to also have only a relatively small width on its wide end, while having relatively large lateral surfaces.

A preferably thermally conductive material is arranged between the flat regions of the first surface of the heat source and the third surface of the wedge element in order to compensate for surface roughness and prevent air enclosures that impair a heat transfer. Preferably, an also thermally conductive material is arranged between the second surface of the heat sink and the fourth surface of the wedge element. The thermally conductive material may be a thermally conductive paste or a gap filler and may contain, e.g., a silicone-containing material. In this way, any residual gaps still remaining after the insertion of the wedge element into the wedge-shaped intermediate space can be bridged with the least possible thermal resistance. The fewer surface irregularities there are on the first through fourth surfaces and the more accurate the angle is between the first and second, as well as between the third and fourth, surfaces, the smaller is the remaining volume that is filled by a thermally conductive material and the better is the heat transfer.

The carrier element may be the circuit board of a printed circuit. The heat source may be a chip mounted on the printed circuit such as, for example, a processor. However, the heat source could also be another integrated circuit, any electronic component or another heat-generating element that requires cooling. Preferably, the heat sink is a heat sink mounted on the printed circuit, said heat sink consisting of a material displaying high thermal conductivity such as, for example, a metal, e.g., aluminum or copper. Preferably, the heat sink has a ribbed structure or another surface-enlarging form that promotes the release of heat to the ambient air.

Preferably, the heat sink has a support surface on the printed circuit, said surface circumscribing the heat source. In so doing, a single or several not cohesive support surface regions of the heat sink may be present on the printed circuit, said surface regions ensuring that forces are transmitted to the circuit board without damaging the heat source or the chip. The support surface regions of the heat sink may be projecting supports that are, e.g., bonded or screwed to the surface of the circuit board. Preferably, the wedge element consists of a material displaying high thermal conductivity such as, e.g., aluminum or another metal.

In order to hold the wedge element in a position in which it abuts against the heat source as well as against the heat sink, a biasing arrangement may be provided that biases the wedge element in the wedge-shaped intermediate space between the heat source and the heat sink in the direction in which the intermediate space becomes narrower. In this manner, it is possible to apply a force determined in advance to the wedge element, said force determining the force of pressure that—taking into consideration the friction—is exerted by the wedge element on the heat source and the heat sink.

Preferably, on the one hand, the force is selected in such a manner that it is great enough to ensure a secure abutment of the wedge element against the heat source and the heat sink, said abutment not being impaired by gravity or accelerating forces due to vibrations, etc., such as may occur, e.g., in the case of mobile devices. At the same time, the force may be limited to values that do not lead to damage of the heat sink, the carrier element or the heat source, like those of a chip, for example. Preferably, the biasing arrangement is a leaf spring, however, it may also be another type of spring or another element applying an approximately prespecified force. In order to hold the wedge element in the intermediate space, gravity alone may be sufficient and be utilized alone in special cases when the cooling device is aligned in such a manner that the wedge element is inserted—in the direction of gravity—in an intermediate space that narrows from the top to the bottom.

The leaf spring may be screwed to the heat sink. Preferably, it is arranged in a recess inside the heat sink. This embodiment enables a simple assembly of the wedge element. A recess adjoining the wide side of the wedge-shaped intermediate space makes it possible for the wedge element to be shifted somewhat out of the wedge-shaped intermediate space. In this position of the wedge element, the heat sink may be mounted on the printed circuit during assembly, without already coming into contact with the wedge element. Next, the wedge element may be pushed into its final position in the wedge-shaped gap, as a result of which the recess is unblocked again. Now, the spring can be inserted into the recess in order to bias the wedge element and be connected with the heat sink.

BRIEF DESCRIPTION OF THE DRAWING

FIG. 1 shows a shows a schematic representation of a perspective view of a chip cooling device, partially in section, in accordance with a preferred exemplary embodiment of the present invention.

DETAILED DESCRIPTION OF THE PREFERRED EXEMPLARY EMBODIMENT

Now, with reference to the drawing, the present invention will be described in greater detail. FIG. 1 shows a schematic representation of a perspective view, partially in section, of a chip cooling device in accordance with the present invention. FIG. 1 shows a detail of a circuit board 1 of a printed circuit on which a chip 2 is mounted. The chip may be any semiconductor device such as, for example, a microprocessor, that generates enough heat during operation that necessitates measures for cooling said microprocessor in order to prevent malfunction or damage. Located on the chip housing that essentially has the shape of a parallelepiped is the semiconducting substrate 3 or die that is in connection with the entire chip. Compared with the entire chip, the semiconducting substrate has only a small volume, wherein, however, almost the entire heat is released, said heat being removed with the use of the cooling device. Alternatively, the semiconducting substrate 3 could also be integrated in the chip 2. Typically, the chip 2 has (not illustrated) pins that are mechanically connected by soldering connections with the circuit board 1 and electrically connected with (not illustrated) strip conductors on the circuit board 1. Typically, the chip is inserted in a (not illustrated) chip socket, said socket, in turn, being soldered to the circuit board 1.

Heat from the semiconducting substrate 3 is absorbed via a wedge element 17 by a heat sink 7. The heat sink 7 comprises an aluminum plate 10 that is arranged above the chip and projects laterally beyond said chip. The aluminum plate has supports 9 that are provided laterally around the chip, said supports being fastened to the circuit board 1. However, the heat sink 7 could also consist of another metal or another material that displays high thermal conductivity. In order to improve the heat transfer to the air, the heat sink has, on its upper side facing away from the plate, (not illustrated) cooling ribs. A (not illustrated) blower intensifies the removal of heat by forced convection.

The dimensions of the heat sink 7 clearly exceed those of the semiconducting substrate 3, so that said heat sink will dissipate heat generated in the semiconducting substrate 3, without exceeding the available temperature span between the permissible maximum temperature of the semiconducting substrate and the temperature of the ambient air. For reasons of mechanical stability, said heat sink also has a certain thickness and thus a considerable weight. The heat sink 7 is not mounted on the chip 2 or the semiconducting substrate 3 but directly to the circuit board 1 via the supports 9, in order to avoid damage of the chip during assembly of the heat sink or due to later vibrations, in particular in the case of mobile devices.

The underside of the heat sink 7 facing the chip 2 also has a flat surface 12 that is not parallel to the upper surface 11 of the semiconducting substrate 3 but is inclined relative to said surface at an angle of 7°. Following the assembly of the chip and the heat sink, this results in a wedge-shaped intermediate space between the upper surface 11 of the semiconducting substrate 3 and the lower surface 12 of the heat sink 7.

The wedge-shaped intermediate space is closed by the wedge element 17 of aluminum, said wedge element having a rectangular lower surface 13 that abuts against the upper surface 11 of the semiconducting substrate and having a rectangular upper surface 14 that abuts against the lower surface 12 of the heat sink 7. The wedge element could also have another shape or consist of another metal or of a material displaying good thermal conductivity. However, the surfaces 13 and 14 of the wedge element 17 are flat and display the same angle as is subtended by the lower surface 12 of the heat sink 7 and the upper surface 11 of the semiconducting substrate 3.

It is also possible to select a different angle, however, it is preferably within a range of from approximately 5° to 10°. Such an acute angle has the effect that the width of the wedge-shaped intermediate space from its wide end 15 to its narrow end 16 changes only minimally relative to the distance in between. Substantially larger angles are undesirable, because the width of the wedge element—considering the given chip size—becomes too great, and the thermal conductance path becomes too long. Likewise, substantially smaller wedge angles are also not suitable when potential lateral shifts of the wedge element are no longer sufficient to compensate for any expected dimensional deviations of the wedge-shaped intermediate space.

The length and the width of the wedge element 17 are substantially greater than those of the semiconducting substrate, so that the wedge element—if centrally arranged on the semiconducting substrate—considerably projects beyond said substrate on all sides. Already this dissipates the heat flow inside the wedge element and during transfer to the heat sink 7 to a larger cross-sectional area and limits the thermal flow density and the temperature drop. The thickness of the wedge element is dimensioned in such a manner that it just closes the wedge-shaped intermediate space between the heat sink 7 and the semiconducting substrate 3 when the wedge element is arranged approximately centrally on the semiconducting substrate 7, i.e., said wedge element's two surfaces 13 and 14 abut in a planar manner against the respective surfaces of the semi-conducting substrate and the heat sink 7.

Between the surfaces of the wedge element and the adjacent surfaces of the heat sink 7 or the semiconducting substrate 3, it is possible to provide a (not illustrated in FIG. 1) thin layer of a thermally conductive material such as, for example, a thermally conductive paste or a gap filler, in order to even out surface irregularities and improve heat transfer.

Adjacent to the wide end 15 of the wedge-shaped intermediate space, the heat sink 7 has a recess that contains a leaf spring 18. The leaf spring is biased to exert pressure and is fastened on its one end 19—facing away from the wedge element 17—by a screw 20 to the head sink, while its other end 21 abuts against the wide end 22 of the wedge element 17, biasing said wedge element inside the tapering wedge-shaped intermediate space between the heat sink 7 and the semiconducting substrate 3.

Manufacturing tolerances of the individual elements or the soldering connections between the chip 2 and the circuit board 1 can result in considerable width deviations of the intermediate space between the semiconducting substrate 3 and the heat sink 7. Whereas, in accordance with prior art, a kneadable material displaying reduced thermal conductivity is required for bridging the gap that has remained empty, it is possible with the present invention to only laterally shift the wedge element 17 to the required degree until the gap is fully closed and the wedge element 17 abuts in a planar manner against both the semiconducting substrate 3 and the heat sink 7. Inasmuch as said wedge element laterally projects far beyond the semiconducting substrate, a minimal shifting out of its central position does not lead to a substantial deterioration of heat transfer from the semiconducting substrate to the wedge element. Consequently, in the desired position, the wedge element 17 creates a surface contact with the underside 12 of the heat sink 7 and the upper side 11 of the semiconducting substrate 3. As a result of this, a gap filler is no longer required and one only needs to even out the much less pronounced surface roughness instead of the manufacturing tolerances. Inasmuch as the thermal conductivity of metal or other materials used for the heat sink 7 and the wedge element 17 is greater by a multiple than the thermal conductivity of a gap filler that consists of, for example, a silicone-containing material, a clear improvement of the heat transfer is achieved despite the potentially overall greater material thickness of the inclined surfaces 11, 12, 13, 14 and a slight lengthening of the thermally conductive path.

The assembly of the device in accordance with the invention takes place in a simple manner and is carried out, for example, in the following sequence. After mounting the chip 2 on the circuit board 1, the wedge element 17 is placed on the semiconducting substrate 3. However, in so doing, it is not arranged centrally but shifted laterally toward its wider end 22 (in FIG. 1, to the right). Now, the heat sink 7—still without the leaf spring 18—is fastened to the circuit board 1. In so doing, the wide end 15 of the wedge element is partially in the recess of the cooling device, and the upper surface 14 of the wedge element 17 is not yet in abutment with the lower surface 12 of the heat sink 7. Now, the wedge element is horizontally shifted into the wedge-shaped intermediate space (i.e., in FIG. 1, to the left), until its two surfaces are in planar abutment with the corresponding surfaces of the heat sink 7 and the semiconducting substrate 3. Now the pressure-biased leaf spring 18 is inserted into the recess of the heat sink 7 and screwed to the heat sink by means of the screw 20. The free end 21 of the spring now abuts against the wide end 22 of the wedge element 17 and biases said end inside the wedge-shaped intermediate space. The spring is selected in such a manner that it applies sufficient pressure to the wedge element in order to prevent a loosening of said wedge element, e.g., due to vibrations, but does not cause any damage of the semiconducting substrate due to excessive pressure and pushing forces.

The invention claimed is:

1. A cooling device comprising:
   a carrier element;
   a heat source that is adapted to be connected with the carrier element and has a first surface;
   a heat sink that is connected with the carrier element and has a second surface, whereby the first and the second surfaces are located opposite each other and include a wedge-shaped intermediate space;
   a wedge element that is arranged in the wedge-shaped intermediate space and has a third surface, said third surface abutting against the first surface of the heat source, and has a fourth surface, said fourth surface abutting against the second surface of the heat sink; and
   a biasing arrangement disposed to bias the wedge element in the intermediate space between the heat source and the heat sink, the biasing arrangement being insertable into an opening within the heat sink when the heat sink is connected to the carrier element, wherein the biasing arrangement is a leaf spring secured to the heat sink via a threaded connector.

2. A cooling device as in claim 1, wherein each of the first and the second surfaces has a flat region, and the flat regions are located opposite each other and inclined at an angle relative to each other.

3. A cooling device as in claim 2, wherein each of the third and the fourth surfaces of the wedge element has a flat region, and the flat regions of the third and fourth surfaces of the wedge element are inclined at an angle relative to each other, said angle being equal to the angle between the flat regions of the first and of the second surfaces.

4. A cooling device as in claim 3, wherein the wedge element can be inserted in the wedge-shaped intermediate space between the heat source and the heat sink in such a manner that the flat region of the first surface is in planar abutment with the flat region of the third surface and that the flat region of the second surface is in planar abutment with the flat region of the fourth surface.

5. A cooling device as in claim 3, wherein a thermally conductive material is arranged between the flat regions of the first and the third surfaces.

6. A cooling device as in claim 3, wherein a thermally conductive material is arranged between the flat regions of the second and the fourth surfaces.

7. A cooling device as in claim 5, wherein the thermally conductive material is a thermally conductive paste.

8. A cooling device as in claim 1, wherein the carrier element is a printed circuit.

9. A cooling device as in claim 8, wherein the heat sink is a heat sink mounted on the printed circuit.

10. A cooling device as in claim 9, wherein the heat source is a semiconducting substrate of a chip that is mounted on the printed circuit.

11. A cooling device as in claim 9, wherein a support surface of the heat sink on the printed circuit circumscribes the heat source.

12. A cooling device as in claim 1, wherein the wedge element consists of metal.

13. A cooling device as in claim 1, wherein the biasing arrangement is arranged in a recess inside the heat sink.

* * * * *